(12) United States Patent
Urabe et al.

(10) Patent No.: US 11,137,728 B2
(45) Date of Patent: Oct. 5, 2021

(54) PROCESSING DEVICE, CONTROL PARAMETER DETERMINATION METHOD, AND NON-TRANSITORY RECORDING MEDIUM STORING A CONTROL PARAMETER DETERMINATION PROGRAM

(71) Applicant: OMRON Corporation, Kyoto (JP)

(72) Inventors: Kentaro Urabe, Kusatsu (JP); Mamoru Egi, Otsu (JP)

(73) Assignee: OMRON Corporation, Kyoto (JP)

( * ) Notice: Subject to any disclaimer, the term of this patent is extended or adjusted under 35 U.S.C. 154(b) by 157 days.

(21) Appl. No.: 16/485,784

(22) PCT Filed: Jan. 30, 2018

(86) PCT No.: PCT/JP2018/002926
§ 371 (c)(1),
(2) Date: Aug. 13, 2019

(87) PCT Pub. No.: WO2018/168230
PCT Pub. Date: Sep. 20, 2018

(65) Prior Publication Data
US 2020/0064785 A1 Feb. 27, 2020

(30) Foreign Application Priority Data
Mar. 13, 2017 (JP) .............................. JP2017-047857

(51) Int. Cl.
*G05B 13/04* (2006.01)
*G06F 30/20* (2020.01)
(Continued)

(52) U.S. Cl.
CPC ........... *G05B 13/04* (2013.01); *G06F 9/3877* (2013.01); *G06F 17/15* (2013.01); *G06F 30/20* (2020.01)

(58) Field of Classification Search
CPC ....... G05B 13/04; G06F 30/20; G06F 9/3877; G06F 17/15; H02P 29/00
See application file for complete search history.

(56) References Cited

U.S. PATENT DOCUMENTS

| 5,144,549 A | * | 9/1992 | Youcef-Toumi | .... F16C 32/0444 |
| | | | | 700/262 |
| 5,329,442 A | * | 7/1994 | Moshfegh | ............... G05B 13/02 |
| | | | | 700/29 |

(Continued)

FOREIGN PATENT DOCUMENTS

| EP | 0170924 | 2/1986 |
| EP | 0463934 | 1/1992 |

(Continued)

OTHER PUBLICATIONS

"Search Report of Europe Counterpart Application", dated Dec. 28, 2020, p. 1-p. 5.

(Continued)

*Primary Examiner* — Ziaul Karim
(74) *Attorney, Agent, or Firm* — JCIPRNET

(57) ABSTRACT

Provided is a processing device including a simulation system including a model control unit and a predetermined control block structure corresponding to a predetermined device-side configuration, wherein a time response of the predetermined device-side configuration to a predetermined input value is calculated by convolution processing using impulse response information for calculation relating to the predetermined device-side configuration and the predetermined input value, and simulation of the simulation system is performed using the calculated time response. By changing a model control parameter set in the model control unit and performing the simulation, a correlation between a predetermined performance index and the model control parameter is calculated based on a response result of the (Continued)

simulation system, and a device control parameter is determined based on the correlation. According to this configuration, a device control parameter of a motor control device in a control system can be accurately and efficiently determined.

11 Claims, 9 Drawing Sheets

(51) Int. Cl.
  *G06F 9/38* (2018.01)
  *G06F 17/15* (2006.01)

(56) References Cited

U.S. PATENT DOCUMENTS

| | | | |
|---|---|---|---|
| 8,958,914 B2* | 2/2015 | Inazumi | B25J 13/08 |
| | | | 700/260 |
| 9,463,573 B2* | 10/2016 | Inazumi | B25J 9/1633 |
| 10,029,366 B2* | 7/2018 | Nakajima | B25J 9/1633 |
| 2014/0336788 A1* | 11/2014 | Paunonen | G05B 13/04 |
| | | | 700/29 |
| 2017/0261950 A1* | 9/2017 | Mori | G05B 13/042 |

FOREIGN PATENT DOCUMENTS

| | | |
|---|---|---|
| JP | H04340602 | 11/1992 |
| JP | 2006033929 | 2/2006 |
| JP | 2006340480 | 12/2006 |
| JP | 2009122779 | 6/2009 |

OTHER PUBLICATIONS

"International Search Report (Form PCT/ISA/210) of PCT/JP2018/002926," dated Apr. 17, 2018, with English translation thereof, pp. 1-3.

"Written Opinion (Form PCT/ISA/237) of PCT/JP2018/002926", dated Apr. 17, 2018, with English translation thereof, pp. 1-8.

* cited by examiner

| Order of parameter condition | Overshoot amount | Settling time | Model control parameter |
|---|---|---|---|
| 1 | X1 | Y1 | MP1 |
| 2 | X2 | Y2 | MP2 |
| 3 | X3 | Y3 | MP3 |
| 4 | X4 | Y4 | MP4 |
| ... | ... | ... | ... |
| NMax | XNMax | YNMax | MPNMax |

FIG. 8

PROCESSING DEVICE, CONTROL PARAMETER DETERMINATION METHOD, AND NON-TRANSITORY RECORDING MEDIUM STORING A CONTROL PARAMETER DETERMINATION PROGRAM

CROSS-REFERENCE TO RELATED APPLICATION

This application is a 371 of international application of PCT application serial no. PCT/JP2018/002926, filed on Jan. 30, 2018, which claims the priority benefit of Japanese Patent application serial no. 2017-047857, filed on Mar. 13, 2017. The entirety of each of the abovementioned patent applications is hereby incorporated by reference herein and made a part of this specification.

BACKGROUND

Technical Field

The present invention relates to a technique in which, by simulating a control system having a control object including a motor and a motor control device controlling the motor, a device control parameter set in the motor control device is determined.

Related Art

In a servo mechanism, generally, in order to properly control a motor for driving a load device, control parameters (position gain, speed gain, filter cutoff frequency, etc.) of a servo driver controlling the motor are adjusted. An adjustment method of such control parameters can be exemplified by a method performed by actually driving the motor or the load device. In the adjustment method, a control parameter is set for a motor control device such as the servo driver or the like, a response of the load device according to the control parameter is measured, and suitability of the control parameter is determined.

In addition, instead of adjusting the parameter while driving the actual load device as mentioned above, the adjustment method can be exemplified by a method of determining a control parameter based on a simulation result relating to the response of the load device. For example, as shown in Patent Document 1, physical models of a servo driver and a load device are used, a control parameter is set and a simulation is repeatedly performed. Then, the control parameter to be finally set is determined based on a response result obtained as the simulation result.

PRIOR-ART DOCUMENTS

Patent Documents

Patent Document 1: Japanese Patent Publication No. 2009-122779
Patent Document 2: Japanese Patent Publication No. 2006-340480

SUMMARY OF THE INVENTION

Problems to Be Solved by the Invention

In determining a control parameter for driving a motor in a motor control device, in the case of actually driving a control object including a motor or a load device or the like and measuring its response as conventionally, the driving of the motor and the measurement of the response must be executed every time the control parameter is set, and it will take time to determine the control parameter. Further, in the case where the control parameter set at the time of adjustment is improper due to the driving of the actual control object, there is also a risk that the control object may perform an unexpected operation and be damaged.

On the other hand, even if a physical model is used to perform simulation as conventionally at the time of adjusting the control parameter, since the result of the simulation is constrained by the shape or order of the physical model, when there is a difference in the shape of the assumed physical model and characteristics of the actual control object, simulation accuracy may be reduced. In other words, in order to improve the simulation accuracy, it is necessary to reconcile the physical model with the characteristics of the actual control object, and an excessive burden with respect to the adjustment of the control parameter will be placed on a user. In addition, even if the control parameter is determined by utilizing a simulation result, it is necessary to repeatedly execute the simulation, and in order to determine a suitable control parameter, the user will be required to bear a corresponding burden.

The present invention has been made in view of such problems, and aims to provide a technique in which, in a control system having a control object including a motor and a motor control device controlling the motor, a device control parameter of the motor control device is accurately and efficiently determined.

Means for Solving the Problems

In the present invention, in order to solve the abovementioned problems, a predetermined performance index relating to a motor control device is calculated from a simulation result relating to a control system, and the predetermined performance index is utilized to determine a device control parameter of the motor control device; also, as a part of an operation of the simulation, impulse response information relating to a predetermined device-side configuration including a control object is utilized to calculate a time response of the predetermined device-side configuration. According to such a configuration, through the predetermined performance index calculated on the basis of a highly accurate simulation result according to characteristics of the actual control object, it is possible for the user to efficiently and accurately determine the device control parameter.

In detail, the present invention is a processing device which simulates a control system having a control object including a motor and a motor control device controlling the motor and thereby determines a device control parameter set in the motor control device, wherein the processing device includes: a simulation system, including a predetermined feedback system having, as forward elements, a model control unit obtained by modeling one or more controllers included in the motor control device and a predetermined control block structure corresponding to a predetermined device-side configuration including the control object; a holding unit, holding impulse response information for calculation which is information on an impulse response relating to the predetermined device-side configuration; a first response calculation unit, calculating a time response of the predetermined device-side configuration to a predetermined input value by convolution processing using the impulse response information for calculation and the predetermined input value; a second response calculation unit, calculating a response of the simulation system to a command value input to the simulation system by using the time response of the predetermined device-side configuration calculated by the first response calculation unit; a performance index calculation unit, changing a model control parameter set in the model control unit and performing the calculations in the first response calculation unit and the second response calculation unit, thereby calculating a correlation between a predetermined performance index representing a control characteristic of the control object by the motor control device and the model control parameter based on a response result of the simulation system; and a parameter determination unit, determining the device control parameter based on the correlation calculated by the performance index calculation unit.

In the processing device of the present invention, the device control parameter of the motor control device will be determined utilizing the predetermined performance index based on the simulation result obtained by calculation processing in the first response calculation unit and the second response calculation unit based on the above-mentioned simulation system. Here, the above-mentioned processing device includes the simulation system including the predetermined feedback system using as the forward elements the model control unit and the control block structure corresponding to the predetermined device-side configuration, wherein the calculation processing by the first response calculation unit and the second response calculation unit is performed on the premise of the simulation system. With respect to the predetermined device-side configuration, its impulse response information is held as the impulse response information for calculation by the holding unit. Then, the first response calculation unit calculates the time response to the predetermined input value to the predetermined device-side configuration by the convolution processing using the impulse response information for calculation. By utilizing the impulse response information for calculation in this way, the user no longer needs to construct a physical model corresponding to the predetermined device-side configuration for simulation, and it is possible to suitably reflect the actual characteristics of the predetermined device-side configuration including the control object and to accurately calculate the time response thereof.

Here, the impulse response information for calculation held by the holding unit tends to contain inevitable errors resulting from the generation of the information, and is limited due to reasons such as the capacity required for the holding and so on. Hence, a steady-state deviation may remain in the time response calculated by the first response calculation unit, and the simulation accuracy may be affected as a result. However, in the processing device of the present invention, considering a feedback loop included in the simulation system, response calculation processing by the second response calculation unit is performed which uses the time response of the predetermined device-side configuration calculated by the first response calculation unit. For example, the second response calculation unit may, in the predetermined feedback system, calculate the response of the simulation system in accordance with a method of feeding back the time response of the predetermined device-side configuration or a predetermined response result calculated from the time response to an input side of the forward element. Accordingly, the steady-state deviation arising from the impulse response information can be reduced, and simulation accuracy can be improved. In addition, the above-mentioned simulation system can also include other control block structures corresponding to nonlinear compensation or feed forward compensation and so on.

In the above-mentioned processing device, by utilizing a highly accurate simulation processing configuration using the impulse response information for calculation in this way, based on the response result of the simulation system when the model control parameter in the model control unit is changed, the correlation between the predetermined performance index and the model control parameter is calculated by the performance index calculation unit. The response result of the simulation system calculated by the second response calculation unit depends on the model control parameter owned by the model control unit. Therefore, each model control parameter when the model control parameter is changed in this way is associated with the predetermined performance index based on the response result of the simulation system corresponding to each model control parameter, and the above-mentioned correlation is generated. The predetermined performance index is a parameter representing the control characteristic of the control object by the motor control device, and may be, for example, a parameter relating to at least one of settling time, overshoot amount, and rising time in the response result of the simulation system when a predetermined driving command is input to the simulation system.

Accordingly, this correlation shows how the control object is servo-controlled by the motor control device when what kind of model control parameter is set in the simulation system. Therefore, by utilizing the correlation, the parameter determination unit is capable of efficiently determining the device control parameter. In addition, as mentioned above, since the accuracy of the response calculation of the simulation system by the first response calculation unit and the second response calculation unit is relatively high, the accuracy of the device control parameter determined by the parameter determination unit will also be a suitable parameter value in compliance with the control object. Moreover, as a mode of determining the device control parameter by the parameter determination unit, various determination modes can be adopted if based on the above-mentioned correlation. For example, a model control parameter whose corresponding predetermined performance index falls within a range desired by the user may be determined as the device control parameter. Further, the parameter determination unit may determine one value of the model control parameter contained in the above-mentioned correlation as the value of the device control parameter, and, may determine the value of the device control parameter based on a plurality of values of the model control parameter contained in the above-mentioned correlation.

Here, a specific configuration of the above-mentioned simulation system is exemplified below. For example, the impulse response may be the impulse response to a current command, and the model control unit included in the predetermined feedback system may be a speed control block structure relating to speed compensation. In this case, the second response calculation unit calculates a time response of the simulation system so that a speed response calculated by the first response calculation unit is fed back to the speed control block structure in accordance with the feedback method. In addition, the simulation system may include a control block structure or a feedback system and a feed forward system other than the predetermined control block structure, the speed control block structure and the predetermined feedback system.

Here, the processing device so far described may further include a display unit displaying a calculation result group of the predetermined performance index according to a change in the model control parameter based on the correlation calculated by the performance index calculation unit. By displaying the calculation result group of the predetermined performance index in this way, how the control characteristic of the motor control device changes when the model control parameter is changed can be shown visually to the user through a change in the predetermined performance index. Therefore, when one of the predetermined performance index is selected by the user from among the calculation result group displayed by the display unit, the parameter determination unit is capable of determining the one model control parameter corresponding to the selected one predetermined performance index as the device control parameter. By visually utilizing the visual calculation result group of the predetermined performance index in this way, the user can easily grasp the change in the model control parameter and the change in the control characteristic of the motor control device, and the determination of the suitable device control parameter via the selection of one predetermined performance index can be realized.

In addition, the present invention may be obtained from an aspect of a control parameter determination method in which, by simulating a control system having a control object including a motor and a motor control device controlling the motor, a device control parameter set in the motor control device is determined. In this case, the method includes: a first response calculation step of calculating a time response of a predetermined device-side configuration including the control object to a predetermined input value, by convolution processing using impulse response information for calculation which is information on an impulse response relating to the predetermined device-side configuration and the predetermined input value; a second response calculation step of, based on a simulation system including a predetermined feedback system having, as forward elements, a model control unit obtained by modeling one or more controllers included in the motor control device and a predetermined control block structure corresponding to the predetermined device-side configuration, calculating a response of the simulation system to a command value input to the simulation system, by using the time response of the predetermined device-side configuration calculated in the first response calculation step; a performance index calculation step of, by changing the model control parameter set in the model control unit and performing the calculations in the first response calculation unit and the second response calculation unit, calculating a correlation between a predetermined performance index representing a control characteristic of the control object by the motor control device and the model control parameter based on a response result of the simulation system; and a parameter determination step of determining the device control parameter based on the correlation calculated in the performance index calculation step. Moreover, it is possible to apply a technical idea disclosed in relation to the invention of the above-mentioned processing device to the invention of the control parameter determination method, as long as there is no technical inconsistency.

In addition, the present invention can also be grasped from an aspect of a control parameter determination program causing a processing device to execute processing including the following steps, wherein the processing device simulates a control system having a control object including a motor and a motor control device controlling the motor and thereby determines a device control parameter set in the motor control device. The control parameter determination program causes the processing device to execute: a first response calculation step of calculating a time response of a predetermined device-side configuration including the control object to a predetermined input value, by convolution processing using impulse response information for calculation which is information on an impulse response relating to the predetermined device-side configuration and the predetermined input value; a second response calculation step of, based on a simulation system including a predetermined feedback system having, as forward elements, a model control unit obtained by modeling one or more controllers included in the motor control device and a predetermined control block structure corresponding to the predetermined device-side configuration, calculating a response of the simulation system to a command value input to the simulation system, by using the time response of the predetermined device-side configuration calculated in the first response calculation step; a performance index calculation step of, by changing the model control parameter set in the model control unit and performing the calculations in the first response calculation unit and the second response calculation unit, calculating a correlation between a predetermined performance index representing a control characteristic of the control object by the motor control device and the model control parameter based on a response result of the simulation system; and a parameter determination step of determining the device control parameter based on the correlation calculated in the performance index calculation step. Moreover, it is possible to apply a technical idea disclosed in relation to the invention of the above-mentioned processing device to the invention of the control parameter determination program, as long as there is no technical inconsistency.

Effects of the Invention

In a control system having a control object including a motor and a motor control device controlling the motor, a device control parameter of the motor control device can be accurately and efficiently determined.

BRIEF DESCRIPTION OF THE DRAWINGS

FIG. 8 is a diagram showing a configuration of a performance index correlation generated in the parameter determination processing shown in FIG. 7.

DESCRIPTION OF THE EMBODIMENTS

Example 1

Figure 1:
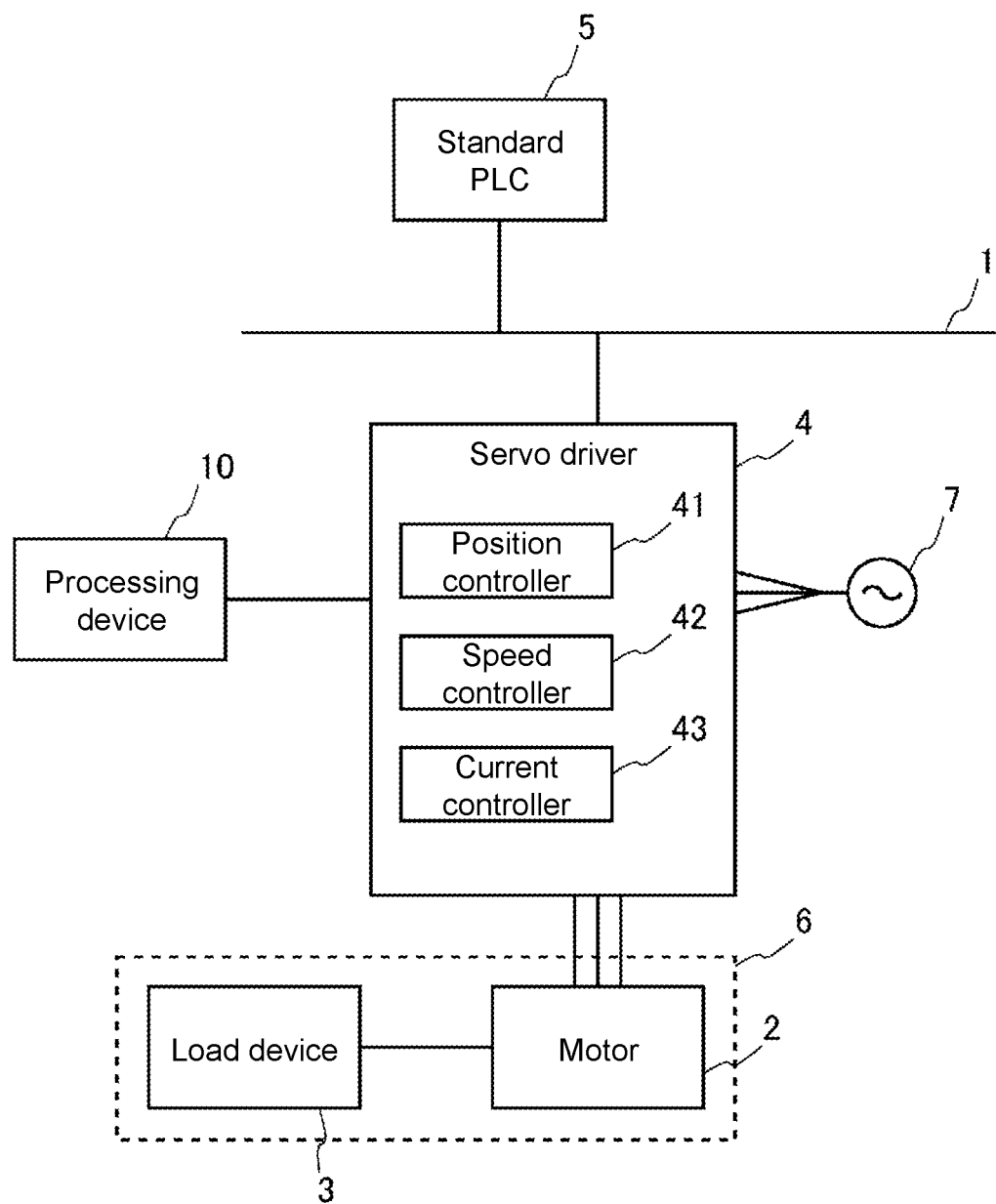
FIG. 1 is a diagram showing a schematic configuration of a control system to be subjected to determination processing of a device control parameter by a processing device according to the present invention.

FIG. 1 is a schematic configuration diagram of a control system to be subjected to parameter determination processing by a processing device according to an embodiment of the present invention. The control system includes a network 1, a motor 2, a load device 3, a servo driver 4, and a standard programmable logic controller (PLC) 5. The control system is a system for driving and controlling the load device 3 together with the motor 2. The motor 2 and the load device 3 are taken as a control object 6 controlled by the control system. Here, the load device 3 can be exemplified by various mechanical devices (for example, an arm of an industrial robot or a conveyance device), and the motor 2 is incorporated in the load device 3 as an actuator that drives the load device 3. For example, the motor 2 is an AC servomotor. An encoder (not shown) is attached to the motor 2, and a parameter signal relating to a motion of the motor 2 is transmitted as feedback to the servo driver 4 by the encoder. The parameter signal (hereinafter referred to as feedback signal) transmitted as feedback includes, for example, positional information on a rotation position (angle) of a rotary shaft of the motor 2, information on a rotational speed of the rotary shaft, and so on.

The servo driver 4 receives a motion command signal relating to the motion of the motor 2 from the standard PLC 5 via the network 1, and receives a feedback signal output from the encoder connected to the motor 2. Based on the motion command signal from the standard PLC 5 and the feedback signal from the encoder, the servo driver 4 calculates a servo control relating to driving of the motor 2, that is, a command value relating to the motion of the motor 2, and supplies a driving current to the motor 2 so that the motion of the motor 2 follows the command value. As the supplied current, AC power sent from an AC power supply 7 to the servo driver 4 is utilized. In the present embodiment, the servo driver 4 is of a type that receives three-phase alternating current, but may also be of a type that receives single-phase alternating current. Moreover, the servo control by the servo driver 4 is feedback control utilizing a position controller 41, a speed controller 42 and a current controller 43 included in the servo driver 4, and the details thereof are described later based on FIG. 2.

Figure 2:
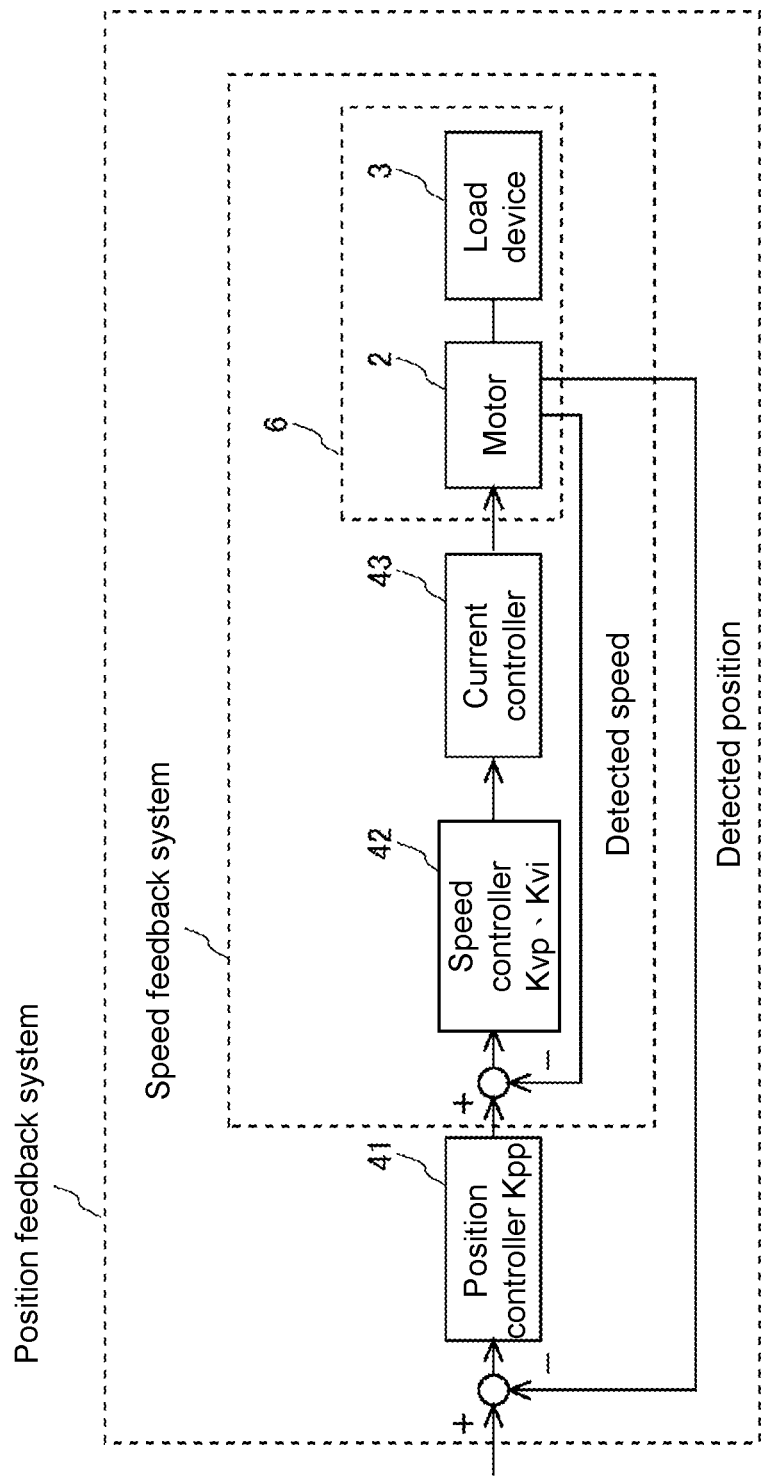
FIG. 2 is a diagram showing a control structure of a servo driver included in the control system shown in FIG. 1.

Here, as shown in FIG. 1, the servo driver 4 includes the position controller 41, the speed controller 42 and the current controller 43, and the above-mentioned servo control is executed by these processing. Therefore, based on a control structure of the servo driver 4 shown in FIG. 2, the content of the above-mentioned servo control by the servo driver 4 is explained. As shown in FIG. 2, the position controller 41 performs, for example, proportional control (P control). Specifically, by multiplying a positional deviation which is a deviation between a position command notified from the standard PLC 5 and a detected position by position proportional gain Kpp, a speed command is calculated. The position proportional gain Kpp owned by the position controller 41 is one of device control parameters of the present invention, and is determined by the parameter determination processing shown in later-described FIG. 7.

Next, the speed controller 42 performs, for example, proportional integral control (PI control). Specifically, by multiplying an integral amount of a speed deviation which is a deviation between the speed command calculated by the position controller 41 and a detected speed by speed integral gain Kvi, and multiplying a sum of the calculation result and the speed deviation by speed proportional gain Kvp, a torque command is calculated. The speed proportional gain Kvp and the speed integral gain Kvi owned by the speed controller 42 are parameters belonging to the device control parameters of the present invention, and are determined by the parameter determination processing shown in later-described FIG. 7. In addition, the speed controller 42 may perform P control instead of PI control. In this case, the speed proportional gain Kvp owned by the speed controller 42 is determined by the parameter determination processing shown in later-described FIG. 7. Next, the current controller 43 outputs a current command based on the torque command calculated by the speed controller 42, whereby the motor 2 is driven and controlled. The current controller 43 includes a filter (first order low-pass filter) or one or more notch filters relating to the torque command, and has, as control parameters, cut-off frequencies or the like relating to the performance of these filters.

The control structure of the servo driver 4 includes a speed feedback system using the speed controller 42, the current controller 43 and the control object 6 as forward elements, and further includes a position feedback system using the speed feedback system and the position controller 41 as forward elements. By the control structure configured in this way, it is possible for the servo driver 4 to servo-control the motor 2 so as to follow the position command supplied from the standard PLC 5.

Here, referring back to FIG. 1, a processing device 10 is electrically connected to the servo driver 4. The electrical connection may be wired connection or wireless connection. The processing device 10 is a device for setting and adjusting the device control parameters of the servo driver 4, and is equipped with adjustment software (program). Specifically, the processing device 10 is a computer having an arithmetic device or a memory and so on, and the executable adjustment software is installed thereon. The processing device 10 uses this adjustment software to adjust the device control parameters (the position proportional gain Kpp, the speed proportional gain Kvp, and the speed integral gain Kvi) so that a response state of the control object 6 by the servo driver 4 becomes a target state. The processing device 10 may be connected to the standard PLC 5. In this case, the processing device 10 accesses the servo driver 4 via the standard PLC 5 and sets and adjusts the device control parameters.

Moreover, the processing device 10 has a function of simulating a response of a control object by the servo driver 4 by the adjustment software. By this simulation function, the processing device 10 is capable of calculating the response of the control object 6 when a predetermined device control parameter is set in the servo driver 4. Then, based on a simulation result by the processing device 10, a user can determine the device control parameter to be set in the servo driver 4, and the determined device control parameter will be transmitted from the processing device 10 to the servo driver 4 and be held in the position controller 41 and the speed controller 42 included in the servo driver 4.

Figure 3:
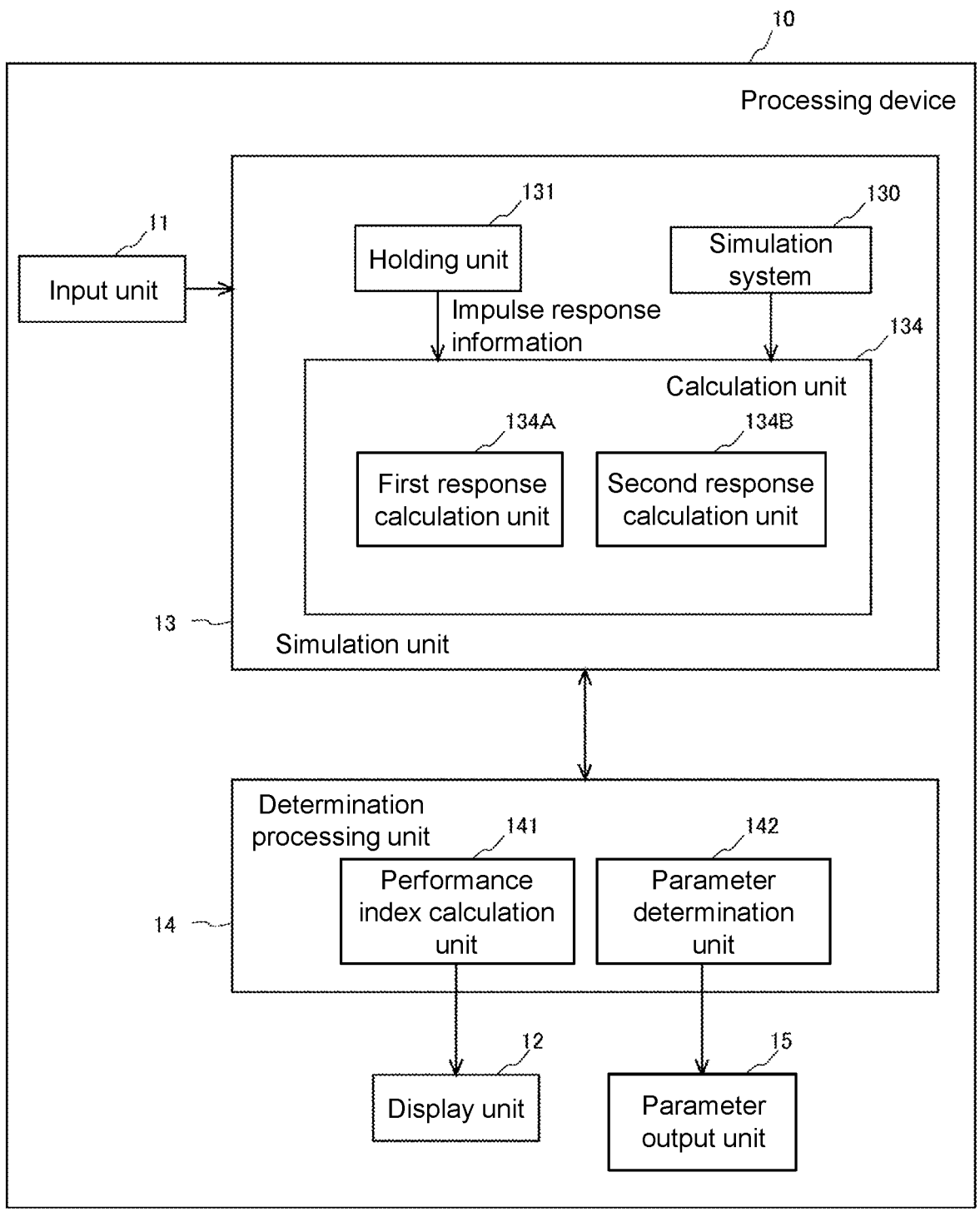
FIG. 3 is a functional block diagram of a processing device according to the present invention.

Next, a configuration of the processing device 10 is explained based on FIG. 3. FIG. 3 is a functional block diagram as an image of various functions executed by the above-mentioned adjustment software or the like executed in the processing device 10. The processing device 10 has an input unit 11, a display unit 12, a simulation unit 13, a determination processing unit 14, and a parameter output unit 15. Among the various functions included in the processing device 10, the input unit 11 is a functional unit receiving an input of information (a command value or a simulation condition to be input for simulation performed in parameter determination processing, etc.) provided for later-described processing for determining the device control parameter of the servo driver 4. Specifically, the input unit 11 is composed of a touch panel which is common hardware, together with the later-described display unit 12. Alternatively, the input unit 11 may be composed of a keyboard or a mouse. Next, the display unit 12 is a functional unit displaying a predetermined performance index or the like which represents a control characteristic of the servo driver 4 and which is calculated by the determination processing unit 14. The display unit 12 may display a simulation result by the simulation unit 13. In addition, as mentioned above, the display unit 12 may be configured as a touch panel including the function of the input unit 11. Alternatively, the display unit 12 may not be an essential component of the processing device 10, and may be provided outside the processing device 10.

The simulation unit 13 is a functional unit calculating a response of the control object 6 when the control object 6 is servo-controlled by the servo driver 4. The simulation unit 13 has a simulation system 130, a holding unit 131, and a calculation unit 134.

Figure 4:
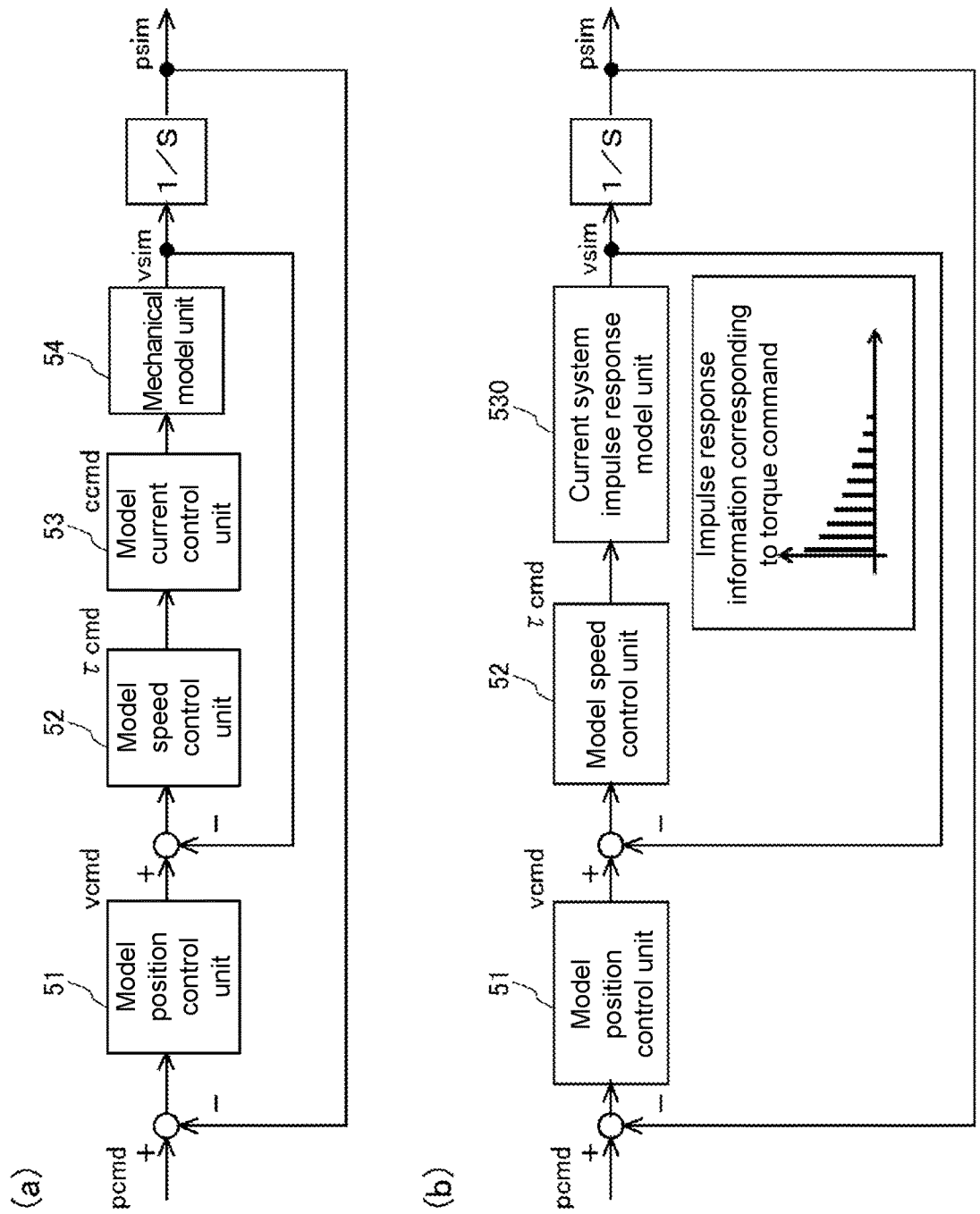
FIG. 4 is a control block diagram showing a structure of a simulation system included in a processing device according to the present invention, wherein part (b) shows a structure of a simulation system using an impulse response model corresponding to a torque command. Also, part (a) shows a basic structure for explaining the simulation system.

First of all, the simulation system 130 is explained based on FIG. 4. The simulation system 130 is a system including a model structure relating to the control object 6 which is to be simulated. The part (a) in the upper part of FIG. 4 shows a basic structure (hereinafter simply referred to as "basic structure") for explaining the simulation system corresponding to a mechanical configuration of the control system shown in FIG. 1. In addition, the part (b) in the lower part of FIG. 4 shows one form of the simulation system 130. The part (b) in the lower part of FIG. 4 shows the structure of the simulation system 130 adopted by the processing device 10.

The basic structure shown in the part (a) in the upper part of FIG. 4 corresponds to the mechanical configuration of the control system shown in FIG. 1 and includes a model position control unit 51, a model speed control unit 52, a model current control unit 53, and a mechanical model unit 54. The model position control unit 51 corresponds to the position controller 41 of the servo driver 4, the model speed control unit 52 corresponds to the speed controller 42 of the servo driver 4, the model current control unit 53 corresponds to the current controller 43 of the servo driver 4, and the mechanical model unit 54 corresponds to the control object 6. In the basic structure shown in the part (a) of FIG. 4, similarly to the servo driver 4, a positional deviation between a position command pcmd and a response position psim which is a system output is input to the model position control unit 51, and a speed command vcmd is output. Then, a speed deviation between the speed command vcmd and a response speed vsim which is an output of the mechanical model unit 54 is input to the model speed control unit 52, and a torque command τcmd is output. Then, the torque command τcmd is input to the model current control unit 53, and a current command ccmd is output. Then, the current command ccmd is input to the mechanical model unit 54, and the above-mentioned response speed vsim, and the above-mentioned response position psim which is an integration result of the response speed vsim, are output.

Here, a control structure shown in the part (b) of FIG. 4, which is one form of the simulation system, is a structure in which the model current control unit 53 and the mechanical model unit 54 in the basic structure shown in the part (a) of FIG. 4 are replaced with a current system impulse response model unit 530 which is a predetermined control block structure, and a speed feedback system using the model speed control unit 52 and the current system impulse response model unit 530 as forward elements as well as a position feedback system using the model position control unit 51 and the speed feedback system as forward elements are included. When the current controller 43 and the control object 6 which are the control system-side mechanical configuration corresponding to the model current control unit 53 and the mechanical model unit 54 are regarded as one mechanical configuration, the current system impulse response model unit 530 has, as an impulse response model, information relating to a speed response at the time when an impulse signal of the torque command is input to the one mechanical configuration. Generation of the impulse response information can be realized by the prior art. Generally, it is realized by performing an inverse Fourier transform on a frequency transfer function relating to the model current control unit 53 and the mechanical model unit 54. An output with respect to an arbitrary input to the current system impulse response model unit 530 can be calculated by convolution processing of the arbitrary input and the impulse response information owned by the current system impulse response model unit 530.

In the case where the simulation system 130 has the control structure shown in the part (b) of FIG. 4, the positional deviation between the position command pcmd and the response position psim which is the system output is input to the model position control unit 51, and the speed command vcmd is calculated. Then, the speed deviation between the speed command vcmd and the response speed vsim is input to the model speed control unit 52, and the torque command τcmd is calculated. Then, when the torque command τcmd is input to the current system impulse response model unit 530, the response speed vsim corresponding to the torque command τcmd is calculated by convolution processing, and the above-mentioned response position psim which is the integration result of the response speed vsim is further calculated. The calculations of each control value in the simulation system 130 are also performed by the first response calculation unit 134A and the second response calculation unit 134B included in the calculation unit 134, and the details thereof are described later.

In this way, the simulation system 130 has the current system impulse response model unit 530 as a control block corresponding to a mechanical configuration including at least the control object 6 which is to be simulated, and has a feedback system using at least the current system impulse response model unit 530 as a forward element. In addition, the holding unit 131 is a functional unit holding the impulse response information for the current system impulse response model unit 530 included in the simulation system 130. In addition, the calculation unit 134 is a functional unit receiving the impulse response information held by the holding unit 131, and performing simulation processing in accordance with the simulation system 130, that is, calculation of the response speed vsim and the response position psim which are response results of the simulation system 130. The calculation unit 134 has the first response calculation unit 134A and the second response calculation unit 134B as sub functional units. The first response calculation unit 134A is a sub functional unit calculating the response speed vsim relating to the convolution processing utilizing the impulse response information owned by the current system impulse response model unit 530 of the part (b) of FIG. 4. In addition, the second response calculation unit 134B is a sub functional unit calculating a time response to a command value input to the simulation system 130, that is, the response position psim, by using a calculation result of the first response calculation unit 134A, that is, the response speed vsim calculated by convolution processing.

Figure 5:
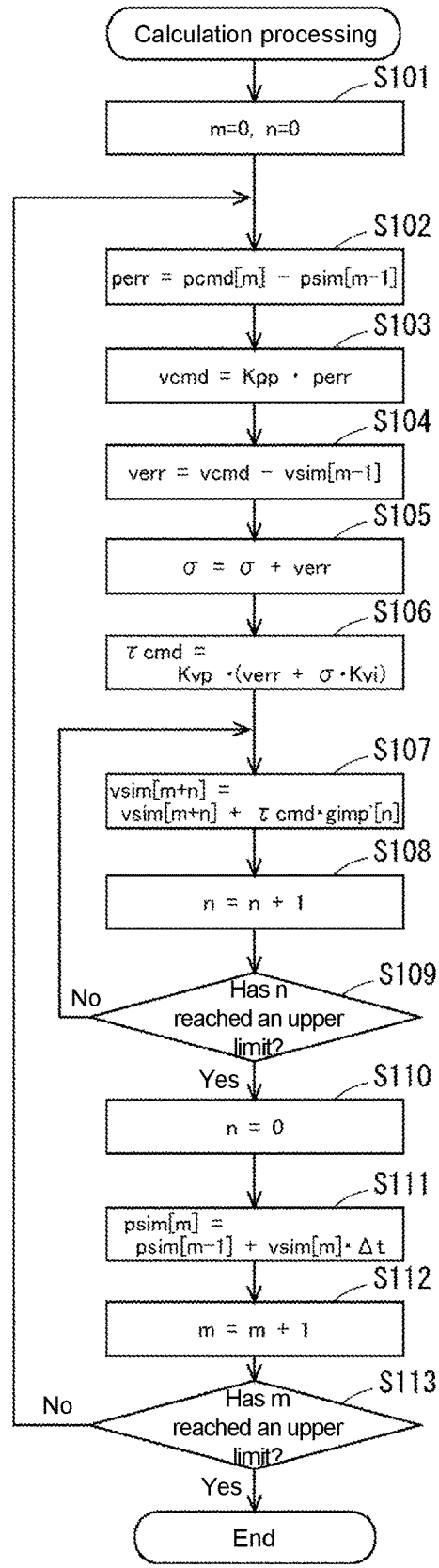
FIG. 5 is a flowchart for calculation processing executed in a processing device according to the present invention.

Here, a flow of calculation processing by the calculation unit 134 for calculating the time response psim of the position and the time response vsim of the speed when a predetermined position command for simulation processing is input to a simulation system is explained based on FIG. 5. The calculation processing is executed in the parameter determination processing shown in later-described FIG. 7. First of all, in S101, a parameter m and a parameter n are initialized. Next, in S102, a positional deviation perr which is the deviation between the position command pcmd and the response position psim is calculated. After that, in S103, by multiplying the positional deviation perr by the position proportional gain Kpp, the speed command vcmd is calculated.

Next, in S104, a speed deviation verr which is the deviation between the speed command vcmd and the response speed vsim is calculated. Further, in S105, the speed deviation verr is integrated and an integral amount σ is calculated; in S106, the torque command τ cmd is calculated in accordance with the following Equation 1.

$$\tau cmd = Kvp \cdot (verr + \sigma \cdot Kvi) \quad \text{(Equation 1)}$$

However, Kvp represents the speed proportional gain, and Kvi represents the speed integral gain. Accordingly, in the present calculation processing, PI control is executed.

Next, in S107 to S109, the torque command τ cmd is used as an input to the current system impulse response model unit 530, and convolution processing for calculating the response speed vsim which is an output from the current system impulse response model unit 530 is performed. Specifically, in S107, an operation in accordance with the following Equation 2 is performed; next, in S108, the parameter n is incremented.

$$vsim[m+n] = vsim[m+n] + \tau cmd \cdot gimp'[n] \quad \text{(Equation 2)}$$

However, gimp'[n] is the impulse response information owned by the current system impulse response model unit 530. This information means a speed response to an impulse-like torque input.

Then, in S109, it is determined whether or not the parameter n has reached an upper limit, that is, it is determined whether or not an upper limit repetition number for repeating the operation by Equation 2 has been reached according to length of the impulse response information gimp'. If a negative determination is made in S109, the processing in and after S107 is repeated; if a positive determination is made, the processing proceeds to S110.

Then, in S110, the parameter n is initialized again. Next, in S111, an operation in accordance with the following Equation 3 is performed.

$$psim[m] = psim[m-1] + vsim[m] \cdot \Delta t \quad \text{(Equation 3)}$$

That is, in S111, the response speed vsim calculated by the convolution processing is integrated, and the response position psim is calculated. After that, in S112, the parameter m is incremented. Then, in S113, it is determined whether or not the parameter m has reached an upper limit, that is, it is determined whether or not an upper limit repetition number for repeating the processing from S102 to S112 has been reached according to time (desired response time) for which simulation is intended to be performed by the calculation processing. If a negative determination is made in S113, the processing in and after S102 is repeated; if a positive determination is made, the present calculation processing is ended.

Figure 6:
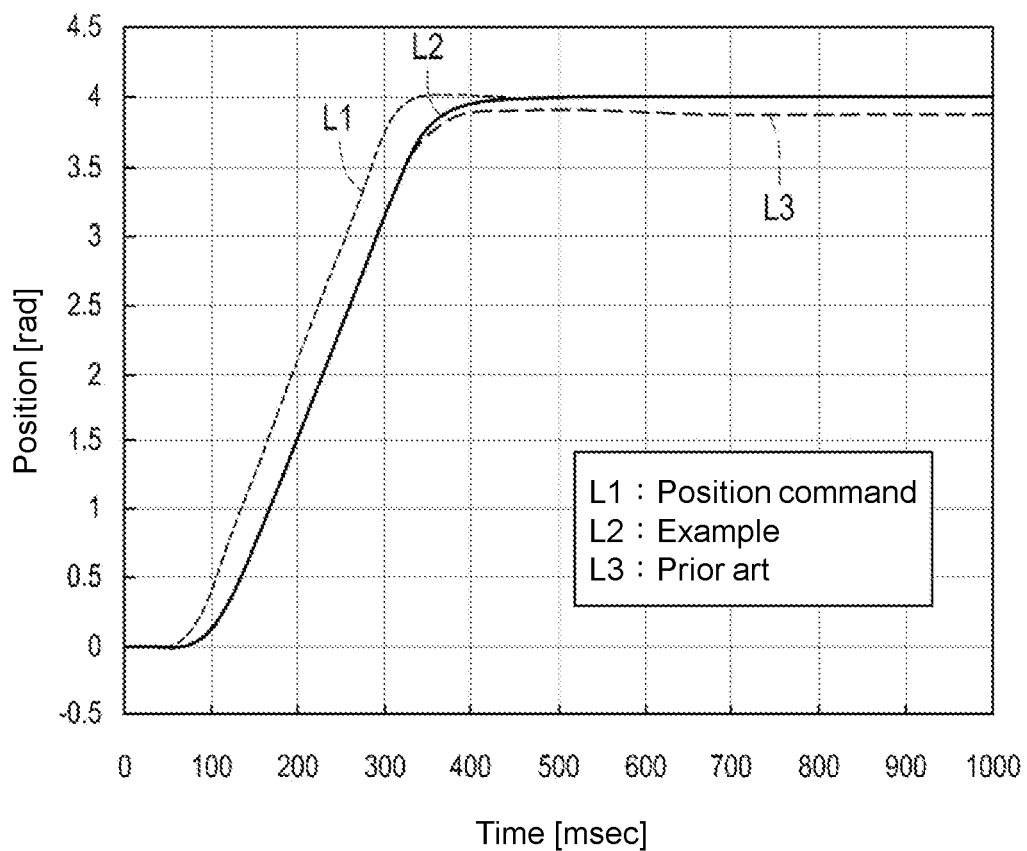
FIG. 6 is a diagram showing a simulation result by the calculation processing shown in FIG. 5.

Here, FIG. 6 shows a simulation result when the calculation processing shown in FIG. 5 is executed. The horizontal axis in FIG. 6 represents time, and the vertical axis represents the response position psim. Here, line L1 in FIG. 6 represents a transition of the position command pcmd, and line L2 represents a transition of the response position psim by the above-mentioned calculation processing. Also, for comparison, line L3 represents a transition of a position calculated in accordance with the prior art, specifically, in the case represented by an impulse response model unit (hereinafter referred to as "conventional impulse response model unit") corresponding to the entire basic structure including the model position control unit 51, the model speed control unit 52, the model current control unit 53, the machine model unit 54 and the feedback loop shown in the part (a) of FIG. 4, a transition of a position calculated by convolution processing using the position command pcmd input to the conventional impulse response model unit and the impulse response information owned by the conventional impulse response model unit.

In general, the impulse response information included in an impulse response model unit tends to contain inevitable errors resulting from the generation of the information, and its time axis is limited information. Hence, as a result, in the case of using the conventional impulse response model, a response result cannot completely follow the position command, and a steady-state deviation remains, resulting in a decrease in simulation accuracy. In order to reduce the steady-state deviation, the time axis in the impulse response information should be as long as possible; however, in that case, since capacity of the impulse response information may increase, and calculation time for simulation may increase, it is not practical.

On the other hand, according to the calculation processing shown in FIG. 5, the response result suitably follows the position command, and the steady-state deviation is largely eliminated. The reason is that, as shown in the part (b) of FIG. 4, in calculating the response speed vsim, the convolution processing is performed using the impulse response information owned by the current system impulse response model unit 530 using the torque command τcmd as an input, and the feedback system using the current system impulse response model unit 530 and the model speed control unit 52 as forward elements is included in the simulation system 130. That is, in the calculation of the response position psim, combined processing of the calculations by the first response calculation unit 134A and the calculation by the second response calculation unit 134B is performed. Accordingly, unlike the case of using the conventional impulse response model unit that calculates the position response using only the impulse response information, if according to the calculation processing shown in FIG. 5, the steady-state deviation at the response position can be effectively eliminated. In addition, in calculating the response position, by utilizing the convolution processing by using the impulse response information, there is no need to set a physical model of the control object for the calculation, and therefore a highly accurate response result more compliant with the actual machine can be obtained.

Here, referring back to FIG. 3, the determination processing unit 14 and the parameter output unit 15 are explained. The determination processing unit 14 is a functional unit utilizing a simulation result by the simulation unit 13 to determine a device control parameter for the position controller 41 and the speed controller 42 included in the servo driver 4, in order to suitably realize the above-mentioned servo control over the control object 6 by the servo driver 4. In addition, the determination processing unit 14 has a performance index calculation unit 141 and a parameter determination unit 142. The performance index calculation unit 141 is a functional unit calculating a predetermined performance index indicating a control characteristic of the control object 6 by the servo driver 4, and the parameter determination unit 142 is a functional unit determining a device control parameter for the servo driver 4 based on the performance index calculated by the performance index calculation unit 141. Next, the parameter output unit 15 is a functional unit instructing that the device control parameter for the servo driver 4 that is determined by the parameter determination unit 142 be output to and set in the servo driver 4.

Figure 7:
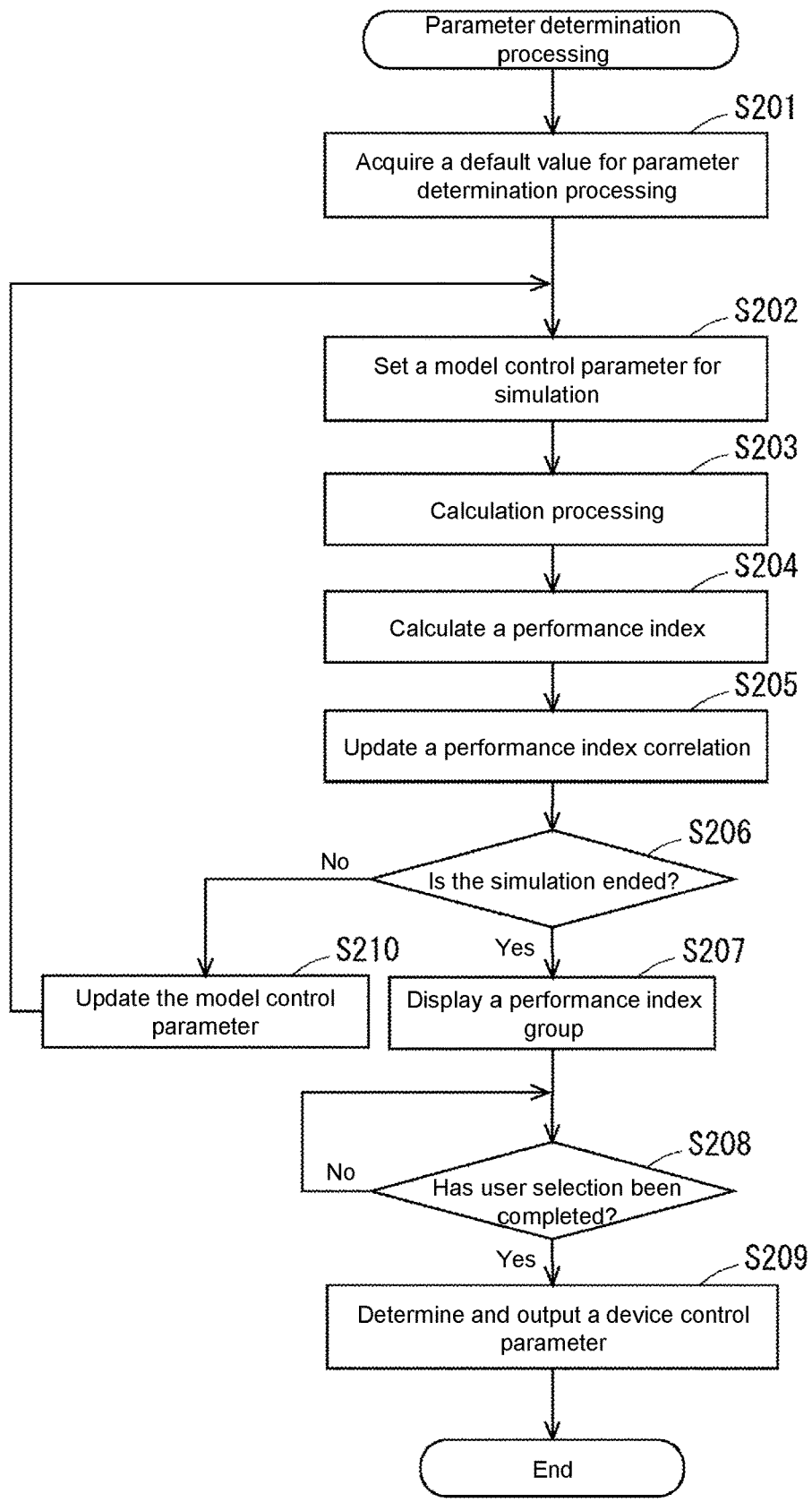
FIG. 7 is a flowchart for parameter determination processing which determines a device control parameter of a servo driver and which is executed in a processing device according to the present invention.

Here, the parameter determination processing executed by the determination processing unit 14 including the performance index calculation unit 141 and the parameter determination unit 142 is explained based on FIG. 7. The parameter determination processing is executed when an execution command of the processing is input via the input unit 11. First of all, in S201, a default value for performing the present parameter determination processing is acquired. In the present parameter determination processing, the calculation processing shown in FIG. 5 is performed in determining the device control parameter of the servo driver 4 (see later-described S203). The conditions necessary for the calculation of the response result of the simulation system 130 performed in the calculation processing (for example, conditions such as moving distance, moving speed, time constant and so on relating to a simulated positioning operation), the initial values of control gain of the model position control unit 51 or the model speed control unit 52 of the simulation system 130 (hereinafter referred to as "model control parameters"), and so on are regarded as default values for performing the parameter determination processing. Moreover, the initial values of the model control parameters are properly set considering an inertia ratio of the motor 2 and the load device 3 in the control object 6 and the actual machine configuration such as a driving force transmission mechanism connecting the motor 2 and the load device 3, or the like.

Next, in S202, for the calculation of the response result of the simulation system 130 performed in the above-mentioned calculation processing, a model control parameter is set in the model position control unit 51 or the model speed control unit 52 of the simulation system 130. Specifically, if immediately after S201 mentioned above, the initial value of the model control parameter acquired in S201 is utilized in the setting in S202, and, if immediately after later-described S210, the value of the model control parameter updated in S210 is utilized in the setting in S202.

When the processing in S202 ends, the above-mentioned calculation processing is executed in S203. One example of the simulation result by the calculation processing is as shown in FIG. 6 described above, wherein transitions of predetermined parameters obtained during the calculation processing, such as not only the position response but also the speed response, are also contained in the simulation result by the calculation processing. In this simulation result, the response result of the simulation system 130 is accurately calculated. Therefore, in subsequent S204, a predetermined performance index is calculated based on the simulation result obtained by the calculation processing in S203. The predetermined performance index is a parameter representing the control characteristic of the control object 6 by the servo driver 4; in the present embodiment, overshoot amount and settling time in the simulation result are typically used. The overshoot amount is defined as an amount of excess movement from an arrival target position in relation to a movement command input to the simulation system 130. The settling time is defined as the time taken from when the position command pcmd reaches the target position to when the positional deviation being a difference between the position command pcmd and the response position psim falls below a predetermined threshold. Furthermore, a rising time defined as the time taken to reach a target arrival speed after the start of movement, or the like, can also be adopted as the predetermined performance index. In this way, the predetermined performance index represents the control characteristic of the control object 6 by the servo driver 4, and any parameter useful for determining the device control parameter of the servo driver 4 can be adopted as appropriate.

When the predetermined performance index is calculated in S204, next, in S205, a performance index correlation in which the calculated predetermined performance index is associated with the model control parameter set in the calculation processing for the calculation is updated and is stored in the processing device 10. Here, FIG. 8 expresses the performance index correlation based on repeated calculation results in the form of a table (the repeated calculation results are due to the determination processing in later-described S206). In this way, the performance index correlation indicates when what kind of model control parameter is set in the simulation system 130, how a response result thereof will become, namely how an assumed control characteristic of the servo driver 4 will become. Moreover, the performance index correlation can be stored in various forms in the processing device 10 if associating the predetermined performance index with its corresponding model control parameter, without having to be formed in the form of a table as shown in FIG. 8. When the processing in S205 ends, the processing proceeds to S206.

In S206, it is determined whether or not the simulation in accordance with the simulation system 130 for determining the device control parameter has ended. In the present embodiment, the simulation is performed multiple times in order to determine a suitable device control parameter based on a plurality of predetermined performance indices. The number of times this simulation is performed is contained in the default value acquired in S201; in the present embodiment, it is assumed that the simulation is repeated NMax times as shown in FIG. 8. If a positive determination is made in S206, the processing proceeds to S207; if a negative determination is made, the processing proceeds to S210.

Here, in S210, the model control parameter set in the simulation system 130 in the next calculation processing is updated to a parameter different from the model control parameter already used. A change width of the model control parameter in one update may be properly determined considering the maximum number of times (NMax times) the simulation is repeated and an assumed limit value of the model control parameter, or may be a fixed value determined in advance. In addition, if there are two or more types of parameters corresponding to the model control parameter (where the position proportional gain Kpp, the speed proportional gain Kvp and the speed integral gain Kvi are contained in the model control parameter, as in the present embodiment), at least one type of the parameters may be updated. When the processing in S210 ends, the processing in and after S202 is repeated again. As a result, the simulation by the above-mentioned calculation processing is repeated, and the performance index correlation is sequentially updated based on the result.

Figure 9:
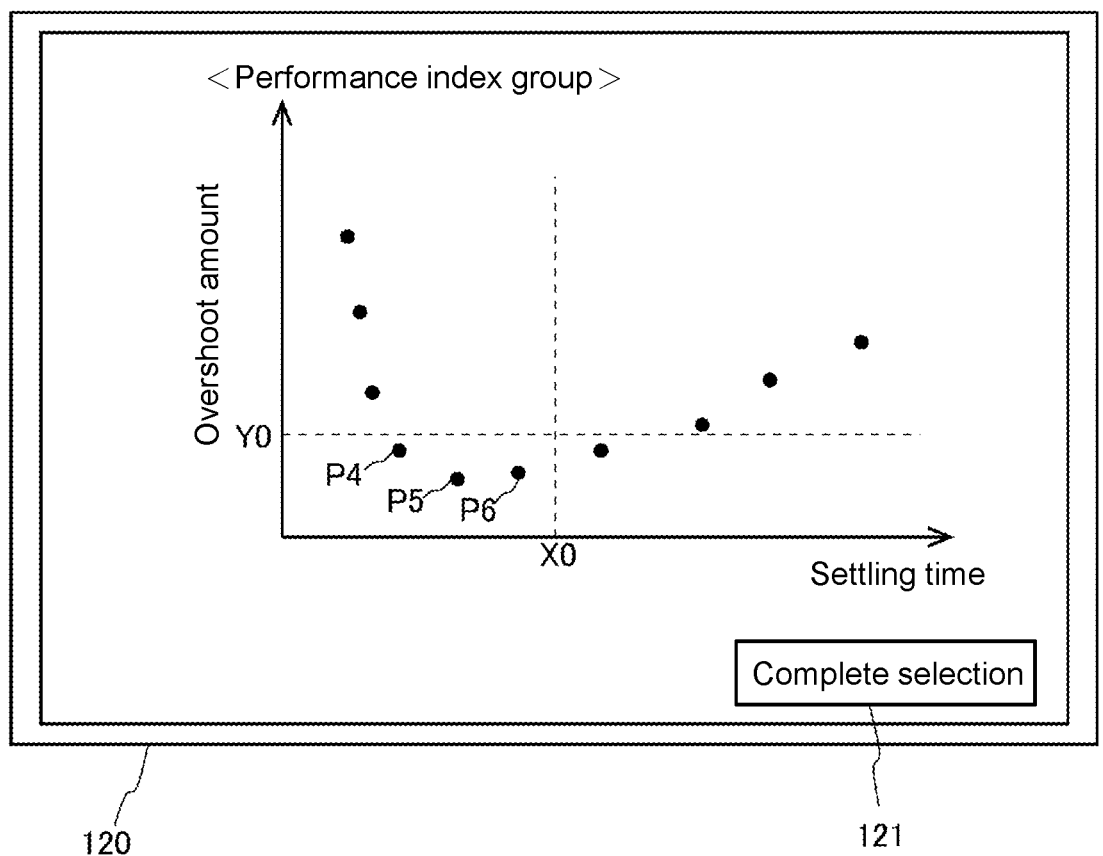
FIG. 9 is a diagram showing a display example of a performance index group generated in the parameter determination processing shown in FIG. 7.

In addition, when a positive determination is made in S206 and the processing proceeds to S207, based on the performance index correlation obtained by the calculation processing repeated so far, a conclusion (group) of the calculation results of the predetermined performance index according to the update of the model control parameter in S210 is displayed on a touch panel 120 of the display unit 12. That is, in the present embodiment, since the calculation processing is repeated NMax times, a group of NMax predetermined performance indices is displayed. Here, FIG. 9 shows a display example thereof on the touch panel 120 of the display unit 12. In the present embodiment, since two parameters, namely the overshoot amount and the settling time, are adopted as the predetermined performance indices, the group of the predetermined performance indices are respectively denoted by black circle points (display points) in a two-dimensional graph with both parameters as evaluation axes.

With respect to the display result of the predetermined performance index group, an upper limit X0 of the settling time allowed in the servo control over the control object 6 by the servo driver 4 and an upper limit Y0 of the overshoot amount are also displayed together. Accordingly, when the control object 6 is servo-controlled by the servo driver 4, the user who sees the touch panel 120 of the display unit 12 can easily recognize the display points (three points P4 to P6 in the present embodiment) corresponding to the predetermined performance indices which are the control characteristic within the allowable range.

Next, in S208, from among the predetermined performance indices displayed on the touch panel 120 of the display unit 12, it is determined whether or not the display point corresponding to one predetermined performance index is selected by the user. At the lower right of the screen of the touch panel 120 of the display unit 12, a "Complete selection" button 121 is also displayed. By the user selecting the display points P4 to P6 corresponding to the predetermined performance indices, which are the target control characteristic on the touch panel 120 and pressing the "Complete selection" button 121, information specifying the predetermined performance indices corresponding to the selected display points is returned to the parameter determination processing side, and the determination in S208 is regarded as a positive determination according to the pressing of the button. Moreover, a negative determination is repeatedly made in S208 until the button is pressed. In addition, the user may be able to select a display point (hereinafter referred to as "non-target display point") other than the display points P4 to P6 corresponding to the predetermined performance indices which are the target control characteristic, or alternatively, may not be able to make the selection in which the target is a display point.

If a positive determination is made in S208, the processing proceeds to S209. In S209, the device control parameter of the servo driver 4 is determined based on the predetermined performance index corresponding to the above-mentioned user selection. The determination is made by the parameter determination unit 142. Specifically, based on the predetermined performance index corresponding to the above-mentioned user selection and the performance index correlation shown in FIG. 8, the model control parameter corresponding to the selected predetermined performance index is determined as the device control parameter of the servo driver 4. For example, when the user selects the display point P4 in accordance with the display result shown in FIG. 9 and presses the "Complete selection" button 121, a model control parameter MP4 set in the simulation system 130 when a predetermined performance index (X4, Y4) corresponding to the point P4 is calculated is determined as the device control parameter of the servo driver 4. Then, the device control parameter determined in this way is output to the servo driver 4 by the parameter output unit 15, and is set in the position controller 41 and the speed controller 42 of the servo driver 4.

In addition, as an alternative of the determination of the device control parameter, a plurality of display points may be selected by the user and may be reflected in determination of a device-side control parameter. For example, in FIG. 9, when the user selects the three points P4 to P6 and presses the "Complete selection" button 121, an average value of three model control parameters associated with three predetermined performance indices corresponding to these display points can also be determined as device-side control parameters.

In this way, according to the present embodiment, by visualizing, on the touch panel 120 of the display unit 12, the predetermined performance index calculated based on a highly accurate simulation result utilizing the simulation system 130 including the feedback system using the model speed control unit 52 and the current system impulse response model unit 530 as the forward elements, the user can easily select a suitable performance index from the display result. As a result, the device control parameter that is expected to make the control characteristic by the servo driver 4 more suitable can be efficiently determined. Particularly, in the response calculation of the simulation system 130 by the above-mentioned calculation processing, the occurrence of steady-state deviation can be eliminated as much as possible while the impulse response information is utilized as mentioned above. Hence, even if the settling time or the like based on the positional deviation is adopted as the performance index, it is possible to determine a suitable device control parameter based on the performance index correlation including the performance index.

As a modification of the present embodiment, the parameter determination unit 142 may automatically determine the device control parameter based on the performance index correlation without undergoing the above-described selection by the user. The automatic determination may be performed in accordance with a predetermined standard, for example, a standard that the device control parameter is determined based on the performance index with the shortest settling time while the settling time and the overshoot amount are within the allowable range. According to this standard, in the example shown in FIG. 9, the model control parameter MP4 corresponding to the point P4 is determined as the device control parameter of the servo driver 4.

What is claimed is:

1. A processing device, simulating a control system having a control object comprising a motor and a motor control device controlling the motor, thereby determining a device control parameter set in the motor control device, wherein the processing device comprises:

a memory, storing an adjustment software; and
a processor, executing the adjustment software to be configured to function as
a simulation system, comprising a predetermined feedback system having, as forward elements, a model control unit obtained by modeling one or more controllers comprised in the motor control device and a predetermined control block structure corresponding to a predetermined device-side configuration comprising the control object;
a holding unit, holding impulse response information for calculation which is information on an impulse response relating to the predetermined device-side configuration;
a first response calculation unit, calculating a time response of the predetermined device-side configuration to a predetermined input value by convolution processing using the impulse response information for calculation and the predetermined input value;
a second response calculation unit, calculating a response of the simulation system to a command value input to the simulation system by using the time response of the predetermined device-side configuration calculated by the first response calculation unit;
a performance index calculation unit, changing a model control parameter set in the model control unit and performing the calculations in the first response calculation unit and the second response calculation unit, thereby calculating a correlation between a predetermined performance index representing a control characteristic of the control object by the motor control device and the model control parameter based on a response result of the simulation system; and
a parameter determination unit, determining the device control parameter based on the correlation calculated by the performance index calculation unit.

2. The processing device according to claim 1, wherein
the impulse response is the impulse response to a current command;
the model control unit comprised in the predetermined feedback system is a speed control block structure relating to speed compensation;
the second response calculation unit calculates a time response of the simulation system so that a speed response calculated by the first response calculation unit is fed back to the speed control block structure.

3. The processing device according to claim 2, further comprising:
a display, displaying a calculation result group of the predetermined performance index according to a change in the model control parameter based on the correlation calculated by the performance index calculation unit.

4. The processing device according to claim 2, wherein
the predetermined performance index is a parameter relating to at least one of settling time, overshoot amount, and rising time in the response result of the simulation system when a predetermined driving command is input to the simulation system.

5. The processing device according to claim 1, further comprising:
a display, displaying a calculation result group of the predetermined performance index according to a change in the model control parameter based on the correlation calculated by the performance index calculation unit.

6. The processing device according to claim 5, wherein, when one of the predetermined performance index is selected by a user from among the calculation result group displayed by the display, the parameter determination unit determines one of the model control parameter corresponding to the selected one of the predetermined performance index as the device control parameter.

7. The processing device according to claim 6, wherein
the predetermined performance index is a parameter relating to at least one of settling time, overshoot amount, and rising time in the response result of the simulation system when a predetermined driving command is input to the simulation system.

8. The processing device according to claim 5, wherein
the predetermined performance index is a parameter relating to at least one of settling time, overshoot amount, and rising time in the response result of the simulation system when a predetermined driving command is input to the simulation system.

9. The processing device according to claim 1, wherein
the predetermined performance index is a parameter relating to at least one of settling time, overshoot amount, and rising time in the response result of the simulation system when a predetermined driving command is input to the simulation system.

10. A control parameter determination method in which, by simulating a control system having a control object comprising a motor and a motor control device controlling the motor, a device control parameter set in the motor control device is determined, the control parameter determination method comprising:
a first response calculation step of calculating a time response of a predetermined device-side configuration comprising the control object to a predetermined input value, by convolution processing using impulse response information for calculation which is information on an impulse response relating to the predetermined device-side configuration and the predetermined input value;
a second response calculation step of, based on a simulation system comprising a predetermined feedback system having, as forward elements, a model control unit obtained by modeling one or more controllers comprised in the motor control device and a predetermined control block structure corresponding to the predetermined device-side configuration, calculating a response of the simulation system to a command value input to the simulation system, by using the time response of the predetermined device-side configuration calculated in the first response calculation step;
a performance index calculation step of, by changing the model control parameter set in the model control unit and performing the calculations in the first response calculation step and the second response calculation step, calculating a correlation between a predetermined performance index representing a control characteristic of the control object by the motor control device and the model control parameter based on a response result of the simulation system; and
a parameter determination step of determining the device control parameter based on the correlation calculated in the performance index calculation step.

11. A non-transitory recording medium storing a control parameter determination program, the control parameter determination program causing a processing device which simulates a control system having a control object comprising a motor and a motor control device controlling the motor and thereby determines a device control parameter set in the motor control device, to execute:
- a first response calculation step of calculating a time response of a predetermined device-side configuration comprising the control object to a predetermined input value, by convolution processing using impulse response information for calculation which is information on an impulse response relating to the predetermined device-side configuration and the predetermined input value;
- a second response calculation step of, based on a simulation system comprising a predetermined feedback system having, as forward elements, a model control unit obtained by modeling one or more controllers comprised in the motor control device and a predetermined control block structure corresponding to the predetermined device-side configuration, calculating a response of the simulation system to a command value input to the simulation system, by using the time response of the predetermined device-side configuration calculated in the first response calculation step;
- a performance index calculation step of, by changing the model control parameter set in the model control unit and performing the calculations in the first response calculation step and the second response calculation step, calculating a correlation between a predetermined performance index representing a control characteristic of the control object by the motor control device and the model control parameter based on a response result of the simulation system; and
- a parameter determination step of determining the device control parameter based on the correlation calculated in the performance index calculation step.

* * * * *